(12) United States Patent
Stäcker et al.

(10) Patent No.: US 7,310,129 B2
(45) Date of Patent: Dec. 18, 2007

(54) METHOD FOR CARRYING OUT A DOUBLE OR MULTIPLE EXPOSURE

(75) Inventors: Jens Stäcker, Dresden (DE); Heiko Hommen, Dresden (DE); Jens Uwe Bruch, Dresden (DE); Marlene Strobl, ShiLin (TW); Karl Schumacher, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 207 days.

(21) Appl. No.: 10/948,570

(22) Filed: Sep. 24, 2004

(65) Prior Publication Data

US 2005/0105073 A1  May 19, 2005

(30) Foreign Application Priority Data

Sep. 25, 2003 (DE) ................. 103 44 645

(51) Int. Cl.
*G03B 27/42* (2006.01)
*G03B 27/44* (2006.01)
*G03B 27/62* (2006.01)
*G03B 27/32* (2006.01)
*G03C 5/00* (2006.01)

(52) U.S. Cl. ............... 355/53; 355/46; 355/75; 355/77; 430/394

(58) Field of Classification Search ............. 355/46, 355/53, 77, 67, 75; 430/5, 394
See application file for complete search history.

(56) References Cited

U.S. PATENT DOCUMENTS

| 4,748,478 | A | | 5/1988 | Suwa et al. | |
|---|---|---|---|---|---|
| 4,982,227 | A | * | 1/1991 | Suzuki | 355/53 |
| 5,472,814 | A | * | 12/1995 | Lin | 430/5 |
| 5,482,819 | A | * | 1/1996 | Tjhia et al. | 430/394 |
| 5,998,068 | A | * | 12/1999 | Matsuoka | 430/5 |
| 6,265,137 | B1 | * | 7/2001 | Hirukawa | 430/312 |
| 6,399,283 | B1 | * | 6/2002 | Hoshi | 430/312 |
| 6,421,111 | B1 | | 7/2002 | Pierrat | |
| 2001/0028984 | A1 | * | 10/2001 | Yamashita et al. | 430/5 |
| 2002/0127747 | A1 | * | 9/2002 | Maltabes et al. | 438/16 |
| 2003/0087193 | A1 | * | 5/2003 | Okada et al. | 430/311 |
| 2003/0142284 | A1 | * | 7/2003 | Lin | 355/77 |
| 2003/0186141 | A1 | * | 10/2003 | Park et al. | 430/22 |
| 2004/0004700 | A1 | * | 1/2004 | Park et al. | 355/53 |
| 2004/0076889 | A1 | * | 4/2004 | Huang et al. | 430/5 |

* cited by examiner

*Primary Examiner*—Henry Hung Nguyen
*Assistant Examiner*—Kevin Gutierrez
(74) *Attorney, Agent, or Firm*—Edell, Shapiro & Finnan, LLC

(57) ABSTRACT

The mutually associated structure patterns, which are provided on one mask, or a plurality of masks for a double or multiple exposure can be received by the mask substrate holder. The mask substrate holder has two receiving stations one for each of the masks. Alternatively, both structure patterns for the double exposure are formed on one mask. The substrate holder has one receiving station. The substrate holder, is displaced from the section including first structure pattern to the second, between the two exposure operations, without the masks having to be loaded or unloaded, and realigned.

14 Claims, 3 Drawing Sheets

METHOD FOR CARRYING OUT A DOUBLE OR MULTIPLE EXPOSURE

CROSS REFERENCE TO RELATED APPLICATIONS

This application claims priority under 35 USC §119 to German Application No. DE 103 44 645.1 filed on Sep. 25, 2003, and titled "Method For Carrying Out a Double or Multiple Exposure," the entire contents of which are hereby incorporated by reference.

FIELD OF THE INVENTION

The invention relates to a method for carrying out a double or multiple exposure of a resist for transferring at least two different structure patterns, which are distributed over one or more masks, into one layer level arranged on a semiconductor wafer.

BACKGROUND

Double or multiple exposures are used in semiconductor fabrication to allow the formation of integrated circuits with particularly high integration densities. One reason for the use of double or multiple exposures (also referred to below just as double exposure) is, for example, the different imaging properties of projection optics between dense, periodic arrangements of structures on the one hand and isolated structures on the other hand.

Fault-free, ideal lenses of projection optics lead to decreases in the size of process windows for lithographic projection onto semiconductor wafers in the case of both isolated and dense, periodic arrangements being present together within a single structure pattern. If the standard distortions of the lenses, known as the aberrations, are also factored in, there is a further deterioration in the process window.

The different structure arrangements could in each case be imaged in optimized form by individually adjusted exposure arrangements. Therefore, since common projection of different arrangements of structures within a pattern can only be imaged using a common projection step, the tendency is for the combined patterns to be separated into the respective arrangements with differing requirements and for these separated arrangements then to be projected onto the wafer in different exposure operations, i.e., the double exposures.

Another reason for carrying out double exposures is, for example, the separation of structures with a high degree of resolution and a very small feature size from structures which have lower demands imposed on the resolution. If, on the one hand, there are certain conditions relating to the arrangement of the structures which are to have a high degree of resolution, such as, for example, row-column patterns with a row-to-column ratio of 1:1, alternating phase masks can be used for this purpose, whereas inexpensive masks with a low resolution suffice for the surrounding, large-area structures.

Accordingly, double exposures require mask sets in which one mask accommodates a part of the structure pattern, which is to be formed together in the resist, and subsequently in the level below. The corresponding structure pattern parts, also referred to below simply as structure patterns, have a relatively high degree of positional accuracy with respect to one another, in order, for example, to allow electrical connection of interconnects which are to be formed. Therefore, it is also necessary to allow very accurate alignment of the corresponding masks in the successive exposure process.

One typical double exposure process is illustrated in FIG. 1. The left-hand side shows an actual projection system. The projection system includes a radiation source 5, a first mask substrate holder 30 with a first mask 4 fit in the holder 30, a lens, which represents the projection optics 6, and a wafer 8, which has been placed on a substrate holder 9. This example in accordance with the prior art is a wafer stepper or scanner. In a size-reducing imaging step (reduction optics), a first structure pattern 51 which has been applied to the mask 4 is transferred in steps into one exposure field 60 on the wafer 8. The first structure pattern 51 may be a number of chip levels, for example, word line levels (gate conductor levels) of a number of DRAM memory chips.

The double exposure is carried out by the first mask 4 having the first structure pattern 51 being regularly exchanged with a second mask 6 with a second structure pattern 52 arranged thereon by the handling units 40, 42. The second mask 6 is initially located in a second mask substrate holder 34 in a parked or loading position.

When a production batch of, for example, 25 wafers reaches an exposure apparatus, such as, for example, a wafer stepper or scanner, for exposure, the masks 4, 6 for the double exposure are removed from a mask store 14 in the exposure apparatus and fed to the second mask holder 34 on a transport path 22 by a transport system 20 in accordance with a manufacturing command. The second mask holder 34 also serves as a pre-loading station for the masks, from which the handling appliances 40, 42 feed the relevant mask into the first mask substrate holder 30, which is used for exposure. However, before the masks 4, 6 are fed to the exposure, it is customary for the bar code on the mask also to be checked in a bar code-reading station 16. Furthermore, in a testing appliance 18, the pellicle, which is generally mounted on masks, is checked for the presence of any particle contamination.

If the relevant masks 4, 6 are not yet even in the exposure apparatus, the masks may also be loaded into the exposure apparatus externally via mask-loading stations 10, 12.

Once the first mask 4 has been placed into the mask substrate holder 30 by the handling appliance 40, the mask 4 first has to be aligned. For this purpose, 16 alignment parameters first have to be loaded. This is followed by the exposure sequence, according to which the exposure fields of the wafer in succession are first exposed using the structure pattern 51 of the first mask 4. Then, the first mask 4 is unloaded by the second handling appliance 42, while in the meantime the first handling appliance 40 unloads the second mask 6 from the second mask holder 34 and places it into the first mask holder 30, which is now free. After this exchange of masks, further alignment with redetermination of the 16 parameters is required. The changeover times for the two masks are typically between 15 and 30 seconds. Two seconds are required for each realignment. After the exposure fields on a first wafer 8 have been completed, a second wafer can then be loaded and exposed starting with the second structure pattern 52 of the second mask 6. This is once again followed by the exchange of masks and the realignment.

In addition to the obvious loss of time caused by the exchange path through the handling appliances 40, 42 and in each case the realignment, a loss of quality in particular on account of the large number of realignments also plays a certain role in assessing the result on the wafer 8. Typical stipulated tolerances for the positional accuracy within a layer level are currently from 10 to 13 nm. Differences in the positional displacements caused by different exposure settings must not exceed 7 to 10 nm. Therefore, additional alignment errors caused by realignment operations having to be carried out should be kept to a minimum, since such errors are in addition to the apparatus-dependent errors.

To improve the quality of the double or multiple exposure process is desirable. Moreover, to increase the throughput involved in the production of integrated circuits requiring double or multiple exposure is also desirable.

SUMMARY

A method for carrying out a double or multiple exposure of a resist for transferring at least two different structure patterns into one layer level arranged on a semiconductor wafer includes providing a mask, which in a first part comprises the first structure pattern and in a second part comprises the second structure pattern;

loading precisely one mask substrate holder of a wafer scanner, which includes an exposure slot, as the exposure apparatus with the mask;

aligning the precisely one mask substrate holder in such a way that in a first position the first part of the mask enters the beam path of projection optics in the exposure apparatus, in order to determine a first set of alignment parameters;

aligning the precisely one mask substrate holder in such a way that in a second position the second part of the mask enters the beam path of the projection optics in order to determine a second set of alignment parameters;

exposing a multiplicity of exposure fields on the semiconductor wafer, the following steps being carried out for each exposure field:

(a) moving the precisely one mask substrate holder using the first set of alignment parameters into the first position;

(b) projecting the first structure pattern into the resist in order to expose a first exposure field on the semiconductor wafer;

(c) moving the precisely one mask substrate holder using the second set of alignment parameters into the second position; and (d) projecting the second structure pattern into the resist in order to expose the first exposure field on the semiconductor wafer without the mask being unloaded from the mask substrate holder between the projection steps; and unloading the mask.

In another general aspect, a method for carrying out a double or multiple exposure of a resist for transferring at least two different structure patterns into precisely one layer level arranged on a semiconductor wafer includes providing a first mask, which comprises the first structure pattern, and a second mask, which comprises the second structure pattern;

loading precisely one mask substrate holder of a wafer scanner, which includes an exposure slot, as the exposure apparatus with the first mask and with the second mask;

aligning the precisely one mask substrate holder in such a way that in a first position the first mask enters the beam path of projection optics in the exposure apparatus, in order to determine a first set of alignment parameters;

aligning the precisely one mask substrate holder in such a way that in a second position the second mask enters the beam path of the projection optics, in order to determine a second set of alignment parameters;

exposing a multiplicity of exposure fields on the semiconductor wafer, with the following steps being carried out for each exposure field:

(a) moving the precisely one mask substrate holder using the first set of alignment parameters into the first position;

(b) projecting the first structure pattern into the resist in order to expose a first exposure field on the semiconductor wafer;

(c) moving the precisely one mask substrate holder using the second set of alignment parameters into the second position; and (d) projecting the second structure pattern into the resist in order to expose the first exposure field on the semiconductor wafer without the first mask or the second mask being unloaded from the mask substrate holder between the projection steps;

and unloading the first mask and the second mask.

Different structure patterns for the double or multiple exposure can be arranged on one or more masks, which are then placed relatively simultaneously on one common mask substrate holder, also known as a stage, for the double exposure. In particular, therefore, there is no need to exchange the masks together with their structure patterns between the substrate holder for the exposure and a further substrate holder for the parked position. This therefore eliminates the time required for the transport path of the corresponding mask changeover and also the time which is required for the alignment operation.

According to a first alternative, the structure patterns are formed on two or more different masks, and during the loading operation with a view to a projection being carried out, the structure patterns are placed on a common mask substrate holder in one receiving station provided for that purpose. Consequently, the two masks are mechanically fixedly coupled to one another, so that a relative offset between the two masks on a one-off basis can be determined and a common alignment process can be carried out. The exposure can then be carried out on a field basis, i.e., for each exposure field, by displacement of the moveable mask substrate holder in order to swap over the mask. One mask can be used to expose the fields and then the mask substrate holder can be displaced once so that then the fields can be exposed using the second mask.

In particular, the first embodiment is particularly attractive since little time is lost between the two exposure operations, so that the local resist conditions are substantially identical at the two exposure instance. Since the displacement of the substrate holder can bring a time benefit compared to the exchanging of masks by handling appliance using the second mask substrate holder in the parked or loading position, by the method or the mask substrate holder according to the invention, to achieve an exposure mode, which alternates between the masks can be provided.

According to a second alternative, the two different structure patterns are formed on a common mask. There is then one mask substrate holder. The two structure patterns are spaced apart from one another. An opaque chrome web on the mask can prevent the influences of light from one structure pattern from influencing the other during exposure.

For each exposure, the mask substrate holder according to the second alternative is displaced such that first, one structure pattern enters the beam path, and then, the other or further structure pattern enters the beam path. In addition, in this displacement step, an aperture mechanism may also be provided in addition to the mask substrate holder. By the aperture mechanism, those parts on the one mask, which correspond to the individual structure patterns, are opened. The displacement of the substrate holder and the displacement of the apertures produce relatively the same effect of the partial exposure of different parts of the mask.

BRIEF DESCRIPTION OF THE FIGURES

The invention is to be explained in more detail below on the basis of an exemplary embodiment and with the aid of a drawing, in which.

DETAILED DESCRIPTION

A common feature of the exemplary embodiments is that one mask substrate holder is provided for a plurality of structure patterns 51, 52 which correspond to one another over the course of the double exposure, i.e., the one mask substrate holder can accommodate these patterns.

Figure 2:
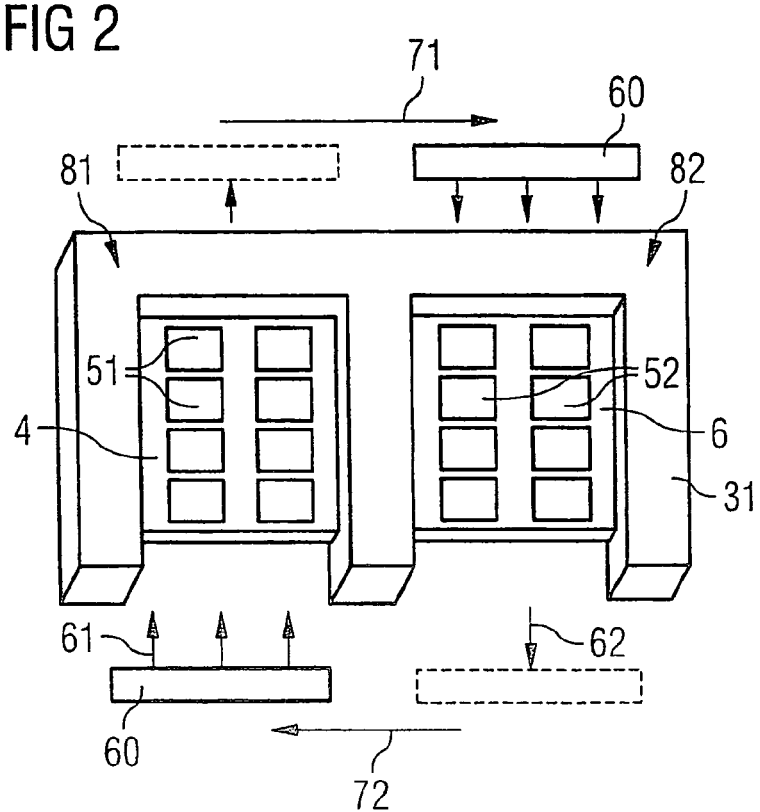
FIG. 2 shows a first exemplary embodiment of a mask substrate holder according to the invention.

FIG. 2 shows a first exemplary embodiment of the present invention. This figure illustrates a first structure pattern 51 arranged on a first mask 4 and a second structure pattern 52 arranged on a second mask 6. The first structure pattern 51 includes, for example, fields of word line structures assigned to the individual chips, while the second structure pattern 52 includes the peripheral regions, assigned to the same chips, of the corresponding memory cell fields.

Figure 3:
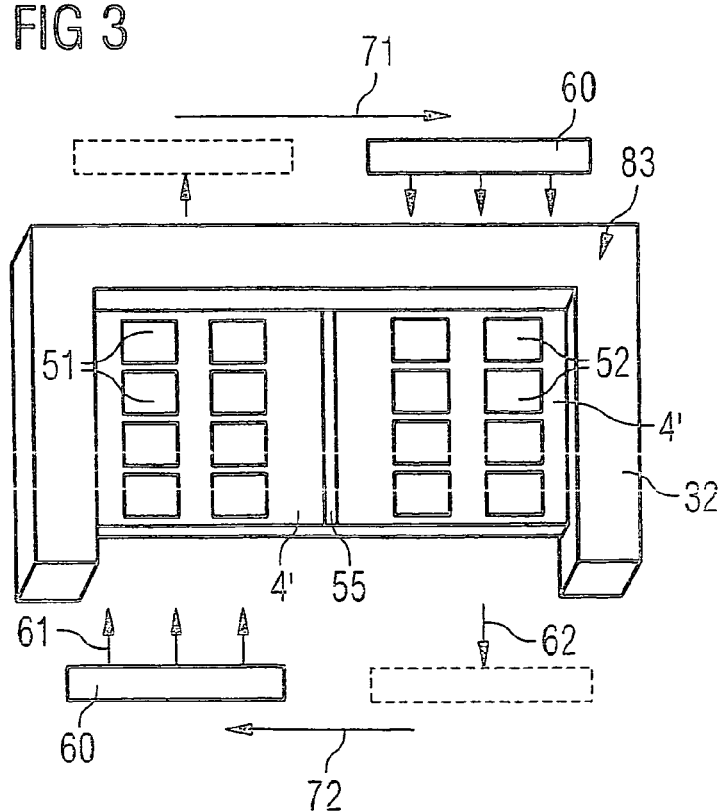
FIG. 3 shows a second exemplary embodiment of a mask substrate holder according to the invention.

In the present document, a structure pattern is to be understood as meaning a collection of individual levels used for different circuits. FIGS. 2 and 3 diagrammatically depict arrangements of 2×4 memory chips. The word line structures of 8 memory cell fields therefore form a first structure pattern 51, and the peripheral regions of 8 memory cell fields accordingly form a second structure pattern 52.

Figure 1:
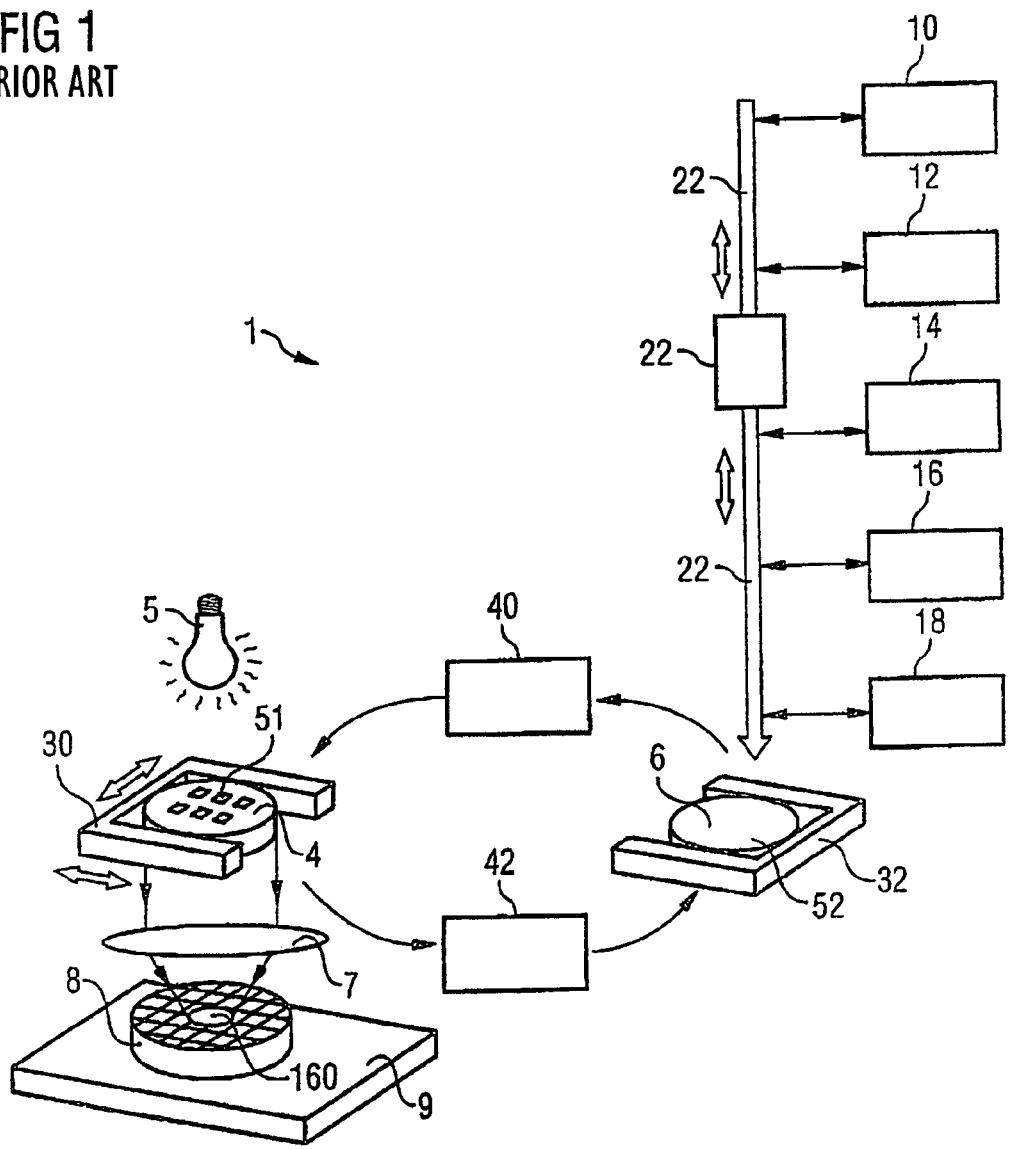
FIG. 1 diagrammatically depicts the construction of an exposure apparatus according to the prior art.

The two masks 4, 6 are removed from the transport system 20 shown in FIG. 1. The mask transport containers 10 or 12 or the internal mask library 14 are fed to the bar code reader 16 and the pellicle test appliance 18, for example, in order for the bar code to be read in each case. If there are no objections at this stage, then, unlike in FIG. 1, first, the first mask 4 and then, the second mask 6 are fed directly to the mask substrate holder 31 shown in FIG. 2 by a handling appliance 40. The two masks are each placed into the respective receiving stations 81, 82.

This is followed by the standard orientation of the first mask 4. For this purpose, 16 alignment parameters are determined and stored. For the alignment, alignment marks directed on the first mask 4 are measured and the substrate holder position is adapted according to the measurement results.

Then, the second mask 6, which has been positioned in the second receiving station 82 on the same mask substrate holder 31, is moved into the beam path and subjected to an alignment measurement. Here, further parameters are calculated, determining the actual offset of the position of the second mask 6 with respect to an ideal position, which corresponds to the second receiving station 82 being opposite the first receiving station 81. These parameters are stored and can quickly be reloaded as soon as the mask substrate holder 31 moves the second mask 6 into the beam path in order to carry out the second exposure.

After the wafer alignment, which is required and is well known from the literature, has been carried out, the exposure sequence then follows. Two alternatives are possible: after the one-off alignment of the two masks 4, 6, first for a first wafer, the first structure pattern 51 is transferred from the first mask 4 the exposure fields. This is followed by the second structure pattern 52 from the second mask, in which case the mask substrate holder 31 displaced once per semiconductor wafer for the single changeover operation. This changeover requires no realignment, since the mask substrate holder has been aligned and the two masks have not been unloaded in the meantime.

After the second exposure has been carried out using the second structure pattern 52, the first wafer is exchanged with a second wafer. There is no need to return the position of the mask substrate holder for exposure using the first structure pattern 51, since the order in which the exposures are carried out is irrelevant. Therefore, this saves a further displacement travel.

In the present example, a wafer scanner is used. In this case, the mask substrate holder 31 with the first and second masks 4, 6, together with the wafer substrate holder and the wafer, moves past a slot 60. The movement is indicated by a scanning direction 61 in FIG. 2. It is possible to save further time if, after the scanning movement 61 and displacement 71 of the mask substrate holder 31 have been carried out, the slot 60 is not moved back into the original position, but rather an opposite scanning direction 62 is used in order for the second mask 6 comprising the second structure pattern 52 to be moved past the slot 60. The original position is reached again when the mask substrate holder 31, moves the first mask 4 including the first structure pattern 51 back into the beam path by a displacement movement 72.

If the displacement mode described above for the scanning direction 61, 62 of the slot 60 and the displacement direction 71, 72 of the mask substrate holder 31 are applied for each individual exposure field 160 on the wafer, a single alignment is required, and consequently, the time saving together with the saving on the transport path, which is customarily required, can be converted into the constant changeover of the mask substrate holder 31 with a relatively slight increase in time. The result is that the first and second exposure operations immediately follow one another, and as a result the differences caused by a constantly changing resist property prior to the subsequent heating or developing processes are reduced.

FIG. 3 shows a second exemplary embodiment of the present invention. In this case, the first structure pattern 51 and the second structure pattern 52 are jointly arranged on one mask 4'. The two patterns are separated from one another by a chrome web 55. The mask format or size, i.e., the mask blank, corresponds to, for instance, twice the size or format of conventional masks. The mask substrate holder has one receiving station 83, but can now receive masks of the above mentioned double size.

The corresponding exposure apparatus 1 is not subject to any changes, in particular, with regard to the slot 60, the lens system 6, or the substrate holder 9. In this exemplary embodiment too, the scanning directions 60, 61 and the displacement directions 71, 72 are implemented. With the fixed arrangement on a common blank, there is no offset between the two mask structures 51, 52. Therefore, to carry out the alignment, 12 parameters are determined and stored, instead of 16 parameters as in the first example above.

In this exemplary embodiment too, one alignment process is required for the two exposure modes as in FIG. 2.

Figure 4:
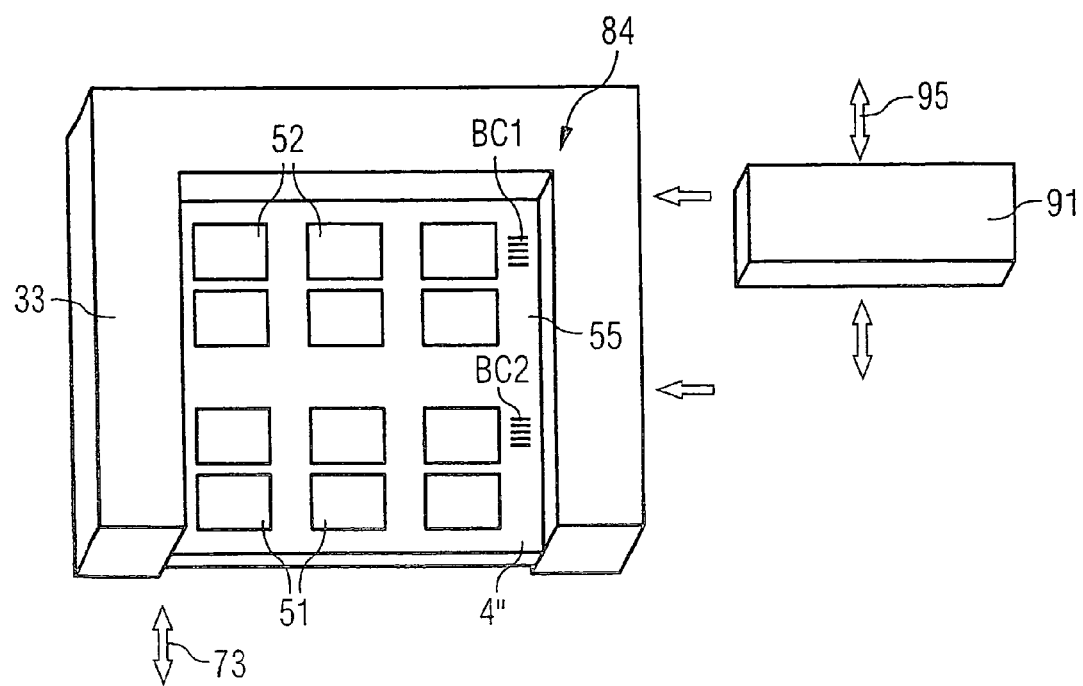
FIG. 4 shows a third exemplary embodiment having a mask according to the invention with two structure patterns using a displaceable aperture mechanism.

FIG. 4 shows a further exemplary embodiment of the invention. The mask substrate holder 33 provided here has the same dimensions and functions as the conventional mask substrate holder 30 shown in FIG. 1. Accordingly, the mask 4", which has been introduced in the receiving station 84, has standardized dimensions. However, both the first structure pattern 51 and the second structure pattern 52 are provided on this mask 4". In this case too, the two structure patterns 51, 52 are separated from one another by a chrome web 55. The width of the chrome web 55 is, for example, at least 2 mm.

The structure patterns 51, 52 take up, in each case, 2×3 chips. The fields have a length of, for example, 23.112 μm×14.864 μm. A conventional double exposure would use two masks 4, 6, which each take up structure patterns having 4×3 chips and have a length of 23.112 μm×29.728 μm. The mask 4", for example, corresponds to a quadruple reticle. For each of the structure patterns 51, 52, bar codes BC1, BC2 are provided on the mask, which identify the corresponding structure pattern in the bar code reader 16. If the combination of the two bar codes BC1, BC2 is recognized in the bar code reader 16, the exposure mode to be described below can automatically be engaged for the double exposure.

For this purpose, it is not necessarily the case that only the mask substrate holder 33 is displaced, but rather it is also possible for the aperture mechanisms, which are generally present in exposure apparatuses 1 to be utilized in addition. For this purpose, for example, an aperture opening 91 is set, corresponding to a size matching the stipulations of the structure pattern 51 or of the structure pattern 52. Ideally, therefore, the structure patterns 51, 52 are formed in equal dimensions on the mask 4". However, it is also possible for the aperture opening 91 to be altered dynamically (on the fly) during the changeover from one structure pattern 51 to the other structure pattern 52, if the patterns 51, 52 have different dimensions. However, this situation will seldom arise in the case of a double exposure in which structures are to be exposed on top of one another.

To carry out the exposure, the opening 91 is moved with respect to the mask 4" in an aperture displacement direction 95 of the aperture mechanisms. It should be ensured that, for the purposes of double exposure, i.e., to ensure that structures are exposed not next to one another but rather above one another, the positioning of the mask substrate holder 33 is matched with respect to the wafer substrate holder 9. This cannot be achieved by the aperture opening 91 alone. Therefore, the mask substrate holder 33 has to be moved with respect to the wafer substrate holder 9. This is indicated by the displacement direction 73 in FIG. 4.

A characteristic feature is that for the purposes of double exposure in the situations outlined above the exposure settings of the exposure apparatus 1 can be advantageously matched to the requirements of the individual patterns 51, 52 during the short changeover between the structure patterns 51, 52 in the beam path. An alteration may, for example, encompass a switch from annular illumination to dipole or quadrupole illumination. In the latter example, there is also no need to determine, store and reload alignment parameters 13 to 16. Conventional mask dimensions can be used, so that relatively insignificant changes to the existing parks of exposure appliances are required. The corresponding aperture setting for reducing the size of the opening 91 is also already available with the existing appliances.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of Reference Symbols: | |
| --- | --- |
| 1 | Exposure apparatus |
| 4 | First mask |
| 5 | Radiation source |
| 6 | Second mask |
| 7 | Projection optics, lens system |
| 8 | Wafer |
| 9 | Wafer substrate holder |
| 10, 12 | Mask transport container |
| 14 | Mask library |
| 16 | Bar code reader |
| 18 | Test appliance for pellicle particle contamination |
| 20 | Transport system |
| 22 | Transport path |
| 30-33 | Mask substrate holder for exposure |
| 34 | Mask substrate holder for parked or loading position |
| 40, 42 | Handling appliances |
| 51 | First structure pattern |
| 52 | Second structure pattern |
| 55 | Opaque chrome web |
| 60 | Slot for wafer scanner |
| 61, 62 | Scanning directions |
| 71-73 | Displacement directions for mask substrate holders |
| 81-84 | Receiving stations for masks |
| 91 | Aperture mechanism |
| 95 | Direction of movement for aperture mechanism |
| BC1, BC2 | Bar codes |

We claim:

1. A method for carrying out a double or multiple exposure of a resist for transferring at least two different structure patterns into one layer level arranged on a semiconductor wafer, comprising:
  providing a mask structure including a first structure pattern and a second structure pattern;
  loading one mask substrate holder of a wafer scanner, as the exposure apparatus with the mask structure, the substrate holder including an exposure slot;
  aligning the one mask substrate holder such that, in a first position, the first structure pattern of the mask structure enters the beam path of projection optics in the exposure apparatus in order to determine a first set of alignment parameters;
  aligning the one mask substrate holder, such that, in a second position, the second structure pattern of the mask structure enters the beam path of the projection optics in order to determine a second set of alignment parameters;
  exposing a plurality of exposure fields on the semiconductor wafer, including, for each exposure field:
    (a) moving the one mask substrate holder using the first set of alignment parameters into the first position;
    (b) projecting the first structure pattern in a first scanning direction into the resist in order to expose a first exposure field on the semiconductor wafer;
    (c) moving the one mask substrate holder using the second set of alignment parameters into the second position; and (d) projecting the second structure pattern in a second scanning direction into the resist immediately after the projection of the first structure pattern into the resist in order to expose the first exposure field on the semiconductor wafer without the mask structure being unloaded from the mask substrate holder between the projection steps, wherein the first and second scanning directions are oriented substantially opposite to one another; and unloading the mask structure.

2. The method of claim 1, wherein the mask structure comprises a first mask including the first structure pattern and a second mask including the second structure pattern.

3. The method of claim 2, wherein the one mask substrate holder includes a first receiving station that receives the first mask and a second receiving station that receives the second mask.

4. The method of claim 2, wherein the first set of alignment parameters and the second set of alignment parameters include a total of sixteen parameters.

5. The method of claim 2, wherein the exposing the plurality of exposure fields includes (a) to (d) being repeated in the reverse order following (d) in order to expose a second exposure field, which directly adjoins the first exposure field on the semiconductor wafer.

6. The method of claim 2, wherein the exposing the plurality of exposure fields includes moving the one mask substrate holder into the first position in a first displacement direction and moving the one mask substrate holder into the second position in a second displacement direction, the first and second displacement directions being oriented substantially opposite to one another.

7. The method of claim 6, wherein the first displacement direction and the second displacement direction are substantially perpendicular to the first scanning direction and to the second scanning direction.

8. The method of claim 6, wherein the first displacement direction and the second displacement direction are substantially parallel to the first scanning direction and to the second scanning direction.

9. The method of claim 6, wherein the exposing the plurality of exposure fields includes arranging an aperture opening such that regions outside the first structure pattern are covered prior to the projection of the first structure pattern into the resist.

10. The method of claim 1, wherein the mask structure comprises a single mask with a first part that includes the first structure pattern and a second part that includes the second structure pattern.

11. The method of claim 10, wherein the loading the one mask substrate holder includes the mask substrate holder having a receiving station for the single mask.

12. The method of claim 10, wherein the first set of alignment parameters and the second set of alignment parameters include a total of twelve parameters.

13. The method of claim 10, wherein the single mask includes an opaque web that is arranged between the first part including the first structure pattern and the second part including the second structure pattern.

14. The method of claim 13, wherein the opaque web comprises a chrome web.

* * * * *